United States Patent [19]

Toyoda et al.

[11] Patent Number: 5,780,162
[45] Date of Patent: Jul. 14, 1998

[54] ALUMINUM NITRIDE SUBSTRATE AND METHOD OF PRODUCING THE SAME

[75] Inventors: Seiji Toyoda; Yoshirou Kuromitsu; Kunio Sugamura; Akira Nakabayashi, all of Omiya, Japan

[73] Assignee: Mitsubishi Materials Corporation, Tokyo, Japan

[21] Appl. No.: 489,677

[22] Filed: Jun. 13, 1995

[30] Foreign Application Priority Data

Jun. 13, 1994 [JP] Japan .................................. 6-130296
Oct. 7, 1994 [JP] Japan .................................. 6-243660

[51] Int. Cl.⁶ .................................................. B32B 15/00
[52] U.S. Cl. .......................... 428/428; 428/432; 428/448; 428/698; 428/699; 428/701; 428/702
[58] Field of Search .................................... 428/215, 216, 428/428, 432, 448, 698, 699, 701, 702; 501/32, 73; 427/375, 376.2

[56] References Cited

U.S. PATENT DOCUMENTS

| | | | |
|---|---|---|---|
| 4,783,695 | 11/1988 | Eichelberger | 257/668 |
| 5,159,432 | 10/1992 | Ohkubo | 250/292 |
| 5,352,482 | 10/1994 | Kondo | 427/96 |
| 5,466,488 | 11/1995 | Toyoda | 427/376.2 |
| 5,468,694 | 11/1995 | Taguchi | 501/77 |

*Primary Examiner*—Timothy Speer
*Attorney, Agent, or Firm*—Oblon, Spivak, McClelland, Maier & Neustadt, P.C.

[57] ABSTRACT

An aluminum nitride (AlN) substrate comprising an AlN sinter, an $Al_2O_3$ layer provided on the sinter, and a glass-mixed $Al_2O_3$ layer which is provided on the $Al_2O_3$ layer and contains $Al_2O_3$ and glass mixed therewith, preferably with an oxide particle-dispersed glass layer and a main glass layer provided on the glass-mixed $Al_2O_3$ layer. The AlN substrate has heat dissipation properties closer to those of AlN itself, does not cause generation of air bubbles at the junction interface between the AlN sinter and the glass-containing layer, and has excellent surface smoothness and corrosion resistance. The very fine conductive layer, etc. may be readily and firmly formed on the substrate in a stable manner.

18 Claims, 6 Drawing Sheets

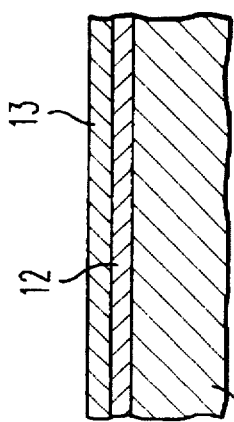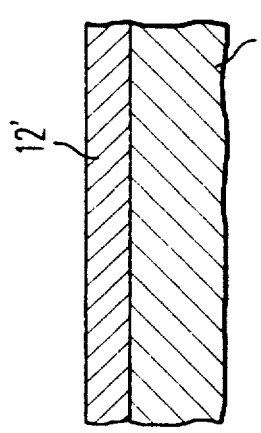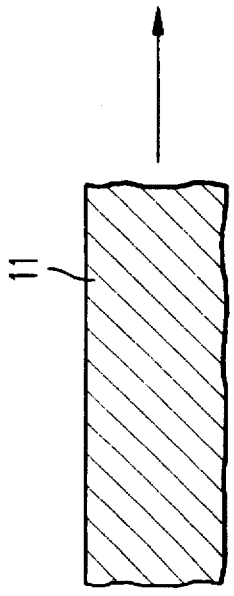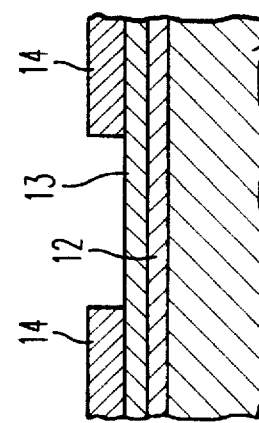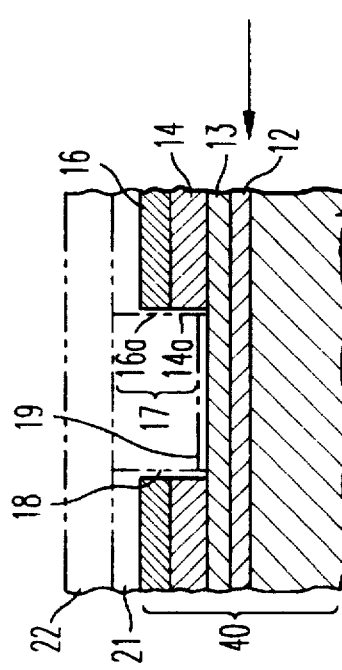

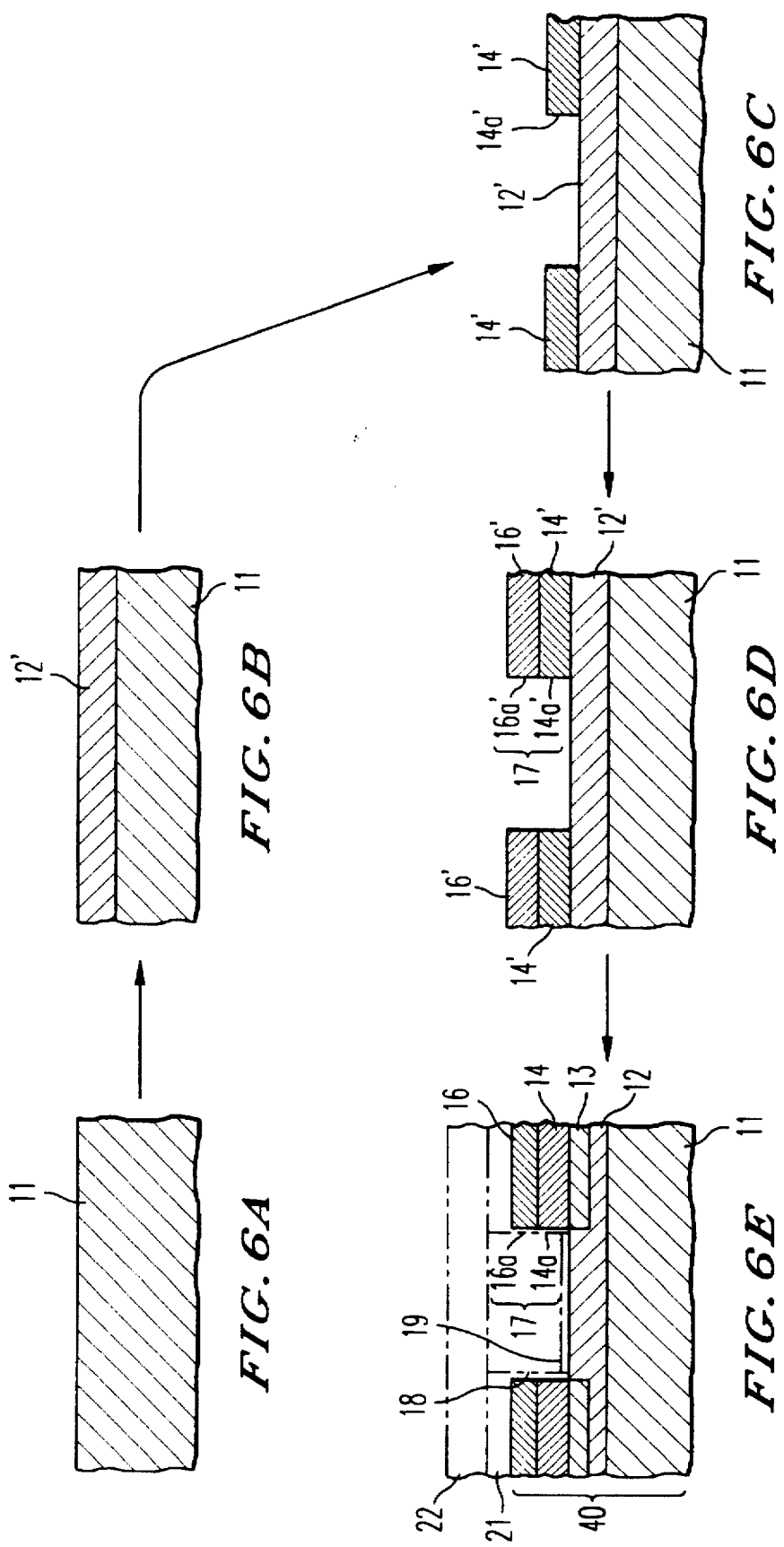

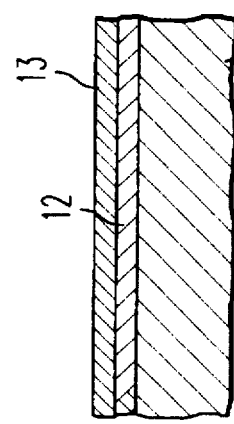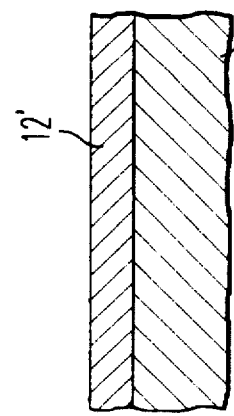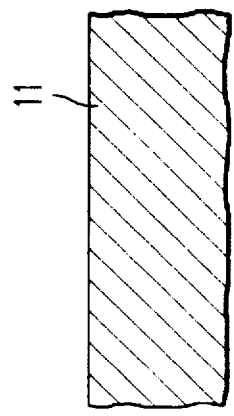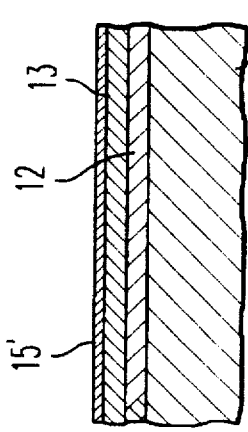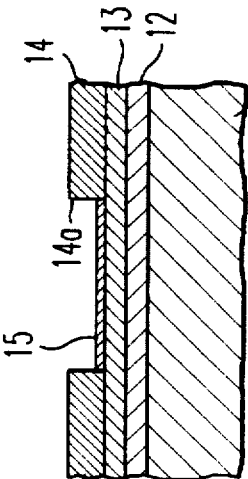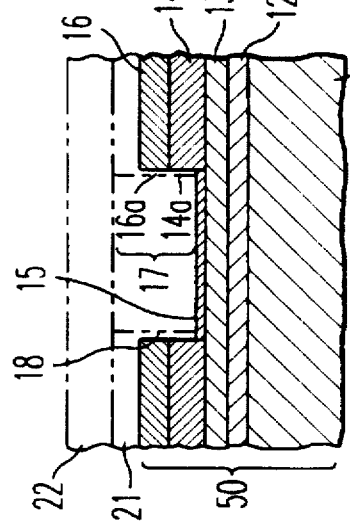

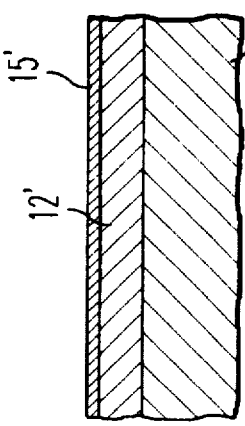
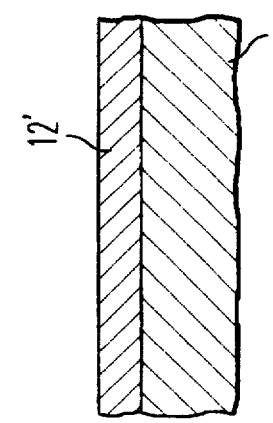
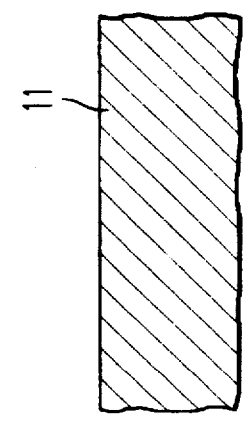
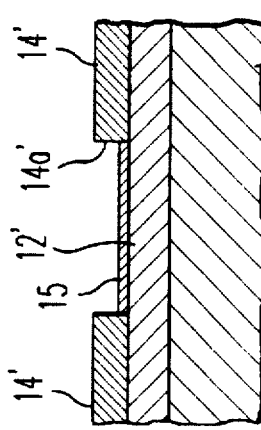
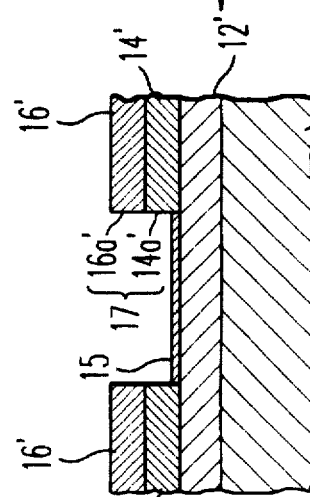
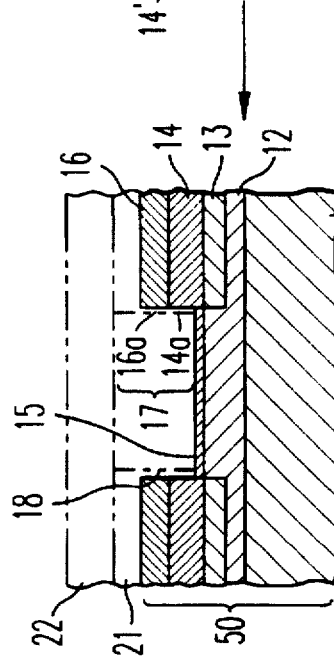

ALUMINUM NITRIDE SUBSTRATE AND METHOD OF PRODUCING THE SAME

BACKGROUND OF THE INVENTION

1. Field of the Invention

The present invention relates to an aluminum nitride substrate which is suitable for use as a substrate for thermal heads, thin-film circuits and thick-film circuits, and a method of producing it. More particularly, the present invention relates to an aluminum nitride substrate for high-density mounted modules which allows mounting of one or more IC chips on a plate-like aluminum nitride sinter and forming of thin-film circuits, as well as to a method of producing it.

2. Description of the Related Art

To date $Al_2O_3$ (alumina) substrates with excellent corrosion resistance, mechanical strength and electrical insulation properties, have been used as substrates for thermal heads of heat transfer printers, substrates for thin-film circuits and substrates for thick-film circuits. For high-quality and high-speed printing, substrates for thermal heads need to dissipate quickly the heat generated by resistors on the glass-glazed layer on the substrate. In addition to the aforementioned $Al_2O_3$ substrates, substrates for modules which comprise a perforated, single- or multi-ply insulating layer formed on a substrate made of a metal such as copper have been disclosed as substrates for thin-film circuits and as substrates for thick-film circuits (U.S. Pat. No. 4,783,695). IC chips are mounted in the perforations of the insulating layer of the substrate for modules, with a thin-film multilayered circuit formed thereon.

Increased mounting density of devices such as IC chips on circuit substrates, due to further miniaturization of electronic equipment, and the increased heat generated by circuit substrates from the packaging of higher power semiconductors, require the substrates to have high levels of heat dissipation. Therefore, in spite of the previously mentioned advantages, $Al_2O_3$ substrates for modules cannot meet these requirements since the thermal conductivity of $Al_2O_3$ is as low as approximately 20 W/m·K, which does not always allow for satisfactory heat dissipation.

For this reason, attempts have been made to mount densely mounted devices, such as IC chips, on to substrates made of aluminum nitride (AlN). Aluminum nitride sinter has a thermal conductivity of 100–180 W/m·K and a thermal expansion coefficient close to that of silicon IC chips. For example, a highly heat-conductive circuit substrate has been described which has a glass layer formed on an oxide layer, which has itself been formed on an aluminum nitride sinter (Japanese Unexamined Patent Application Disclosure SHO 61-119094).

Besides its far superior heat dissipation in comparison with that of $Al_2O_3$, an additional advantage is that formation of the oxide layer contributes to an improved wettability for metals, enabling bonding of the conductor layer to the aluminum nitride circuit substrate. Furthermore, the formation of the glass layer facilitates binding, to the circuit substrate, of the resistor paste containing a dispersion of conductor powder in glass. In cases where the glass layer is formed directly on the aluminum nitride circuit substrate without forming the intervening oxide layer, there is the inconvenience of production of air bubbles in the glass layer resulting from gasification of the nitrogen component of the aluminum nitride by high-temperature treatment in the air during formation of the glass layer. The aforementioned circuit substrate has the advantage of preventing generation of these air bubbles due to presence of the oxide layer ($Al_2O_3$ layer).

The aforementioned highly heat-conductive circuit substrate is based on the technical concept of forming two relatively thick layers on an aluminum nitride sinter: an oxide layer and a glass layer. These two thick layers interfere with the excellent heat dissipation properties of the aluminum nitride.

In addition, AlN substrates for modules raises the following problems:

(1) Where an insulating paste containing glass particles is applied onto an AlN substrate by thick-film printing and heat-treated to form an insulating layer, the glass reacts with the AlN to generate a gas when the insulating layer is sintered, as mentioned above, and thus impairing the binding of the insulating layer to the AlN substrate.

(2) Where an AlN substrate having openings for mounting IC chips is prepared by multi-layering and sintering green sheets of AlN, and a thin-film multilayered circuit is formed with an insulating layer of a polyimide or the like, along with a conductor layer of a metal such as Cu on the section of the AlN substrate other than the perforations, the thin films bulge due to surface defects of the AlN substrate. Such bulging seems to result from lifting of the thin films. The insulation layer or the conductor layer are lifted by the thermal expansion of the air entrapped in the defects of the AlN substrate, upon curing or baking of the composite after surface voids of the AlN substrate have been masked by the insulation or conductor layer.

(3) An AlN substrate which has been metallized by thick-film printing, and then IC chips die bonded to the thick-film section soldering, results in generation of gas by reaction between the glass component of the thick film and the nitrogen component of the AlN. This significantly impairs the binding of the thick film to the AlN in the same manner as in (1) above.

SUMMARY OF THE INVENTION

Accordingly, it is an object of the present invention to provide an aluminum nitride substrate with excellent surface evenness, and heat dissipation properties very close to those of aluminum nitride itself, and a method of producing this substrate.

It is another object of the present invention to provide an aluminum nitride substrate which does not cause generation of air bubbles at the junction interface between the aluminum nitride sinter and the glass-containing layer, and which has excellent binding to the glass-containing layer, and a method of producing this substrate.

It is a further object of the present invention to provide an aluminum nitride substrate which allows for the ready formation of a stable, firm, glass-glazed layer, conductor layer, etc. thereon, and a method of producing this substrate.

Still a further object of the present invention is to provide an aluminum nitride substrate for high-density mounted modules which has excellent heat dissipation properties and allows high-density mounting of devices such as IC chips, and a method of producing this substrate.

Still a further object of the present invention is to provide an aluminum nitride substrate for high-density mounted modules which does not suffer from bulging of the thin film of the thin-film multilayered circuit mounted thereon, and a method of producing this substrate.

The present invention is directed to an aluminum nitride substrate containing a sinter, a glass-mixed $Al_2O_3$ layer, on the sinter, optionally an intervening layer, between the sinter and the glass-mixed $Al_2O_3$ layer, optionally an oxide particle-dispersed glass layer on the glass-mixed $Al_2O_3$ layer, and optionally a main glass layer;

as well as methods for making the substrate.

BRIEF DESCRIPTION OF THE DRAWINGS

FIG. 5 is a set of views illustrative of a method of producing an aluminum nitride substrate for high-density mounted modules according to a fourth embodiment of the present invention;

FIG. 6 is a set of views illustrative of an alternate method of producing an aluminum nitride substrate for high-density mounted modules according to a fourth embodiment of the present invention;

FIG. 7 is a set of views illustrative of a method of producing an aluminum nitride substrate for high-density mounted modules according to a fifth embodiment of the present invention; and FIG. 8 is a set of views illustrative of an alternate method of producing an aluminum nitride substrate for high-density mounted modules according to a sixth embodiment of the present invention.

DETAILED DESCRIPTION

The present invention will now be explained in further detail.

Figure 1:
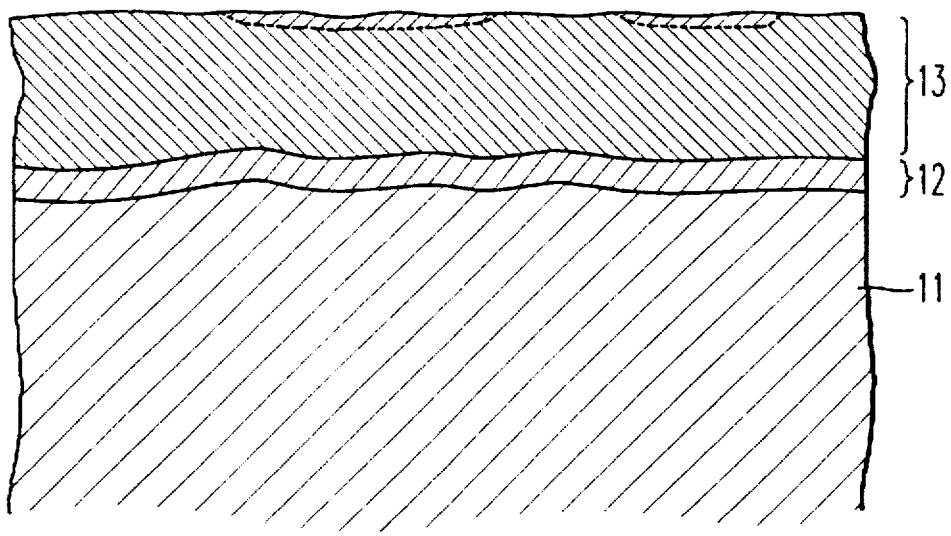
FIG. 1 is an enlarged sectional view of the surface of an aluminum nitride substrate according to a first embodiment of the present invention.

As is shown in FIG. 1, the aluminum nitride substrate 10 according to a first embodiment of the present invention, comprises a plate-like aluminum nitride sinter 11, an $Al_2O_3$ layer 12 provided on this sinter 11, and a glass-mixed $Al_2O_3$ layer 13 which is provided on the $Al_2O_3$ layer 12 and contains $Al_2O_3$ and glass mixed therewith.

Though not shown, a variant configuration of the aluminum nitride substrate 10 according to the first embodiment of the present invention involves the glass-mixed $Al_2O_3$ layer comprising $Al_2O_3$ and glass mixed therewith, formed directly on the aluminum nitride sinter without an $Al_2O_3$ layer.

Figure 2:
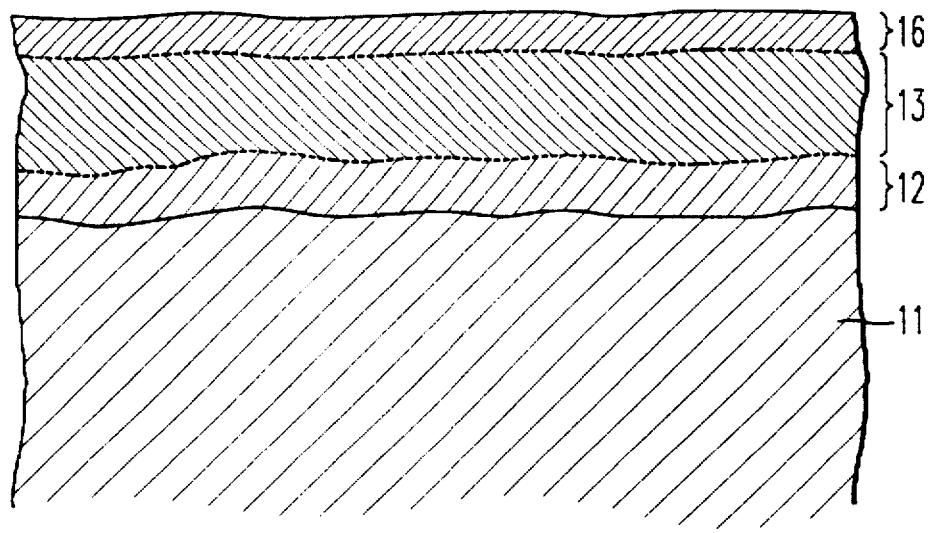
FIG. 2 is an enlarged sectional view of the surface of an aluminum nitride substrate according to a second embodiment of the present invention.

As is shown in FIG. 2, the aluminum nitride substrate 20 according to a second embodiment of the present invention comprises an additional main glass layer 16 on the aforementioned glass-mixed $Al_2O_3$ layer 13. This substrate 20 according to the second embodiment need not have the $Al_2O_3$ layer 12, as is the case with the first substrate 10 with the variant configuration mentioned above.

Figure 3:
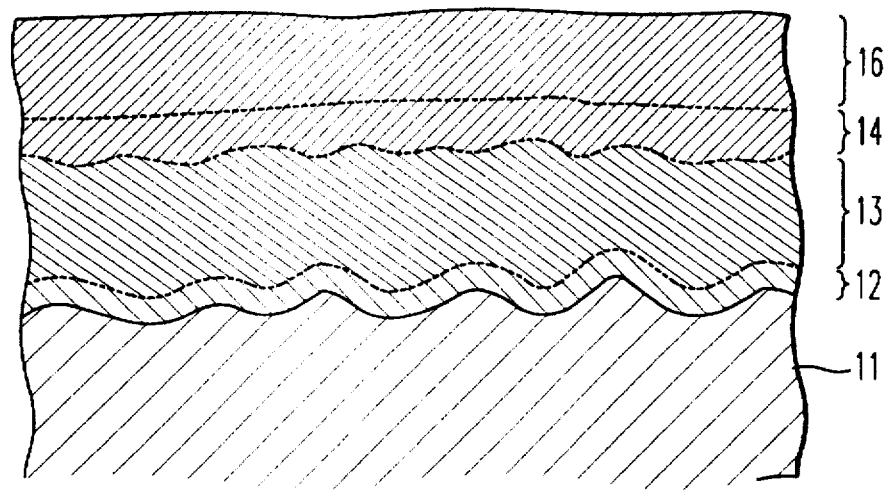
FIG. 3 is an enlarged sectional view of the surface of an aluminum nitride substrate according to a third embodiment of the present invention.

As is shown in FIG. 3, the aluminum nitride substrate 30 according to a third embodiment of the present invention comprises a plate-like aluminum nitride sinter 11, an $Al_2O_3$ layer 12 provided on this sinter 11, a glass-mixed $Al_2O_3$ layer 13 which is provided on the $Al_2O_3$ layer 12 and contains $Al_2O_3$ and glass mixed therewith, an oxide particle dispersed glass layer 14 which is provided on the glass-mixed $Al_2O_3$ layer 13 and includes one or more oxide particles dispersed in the glass which are selected from the group consisting of $Al_2O_3$, $TiO_2$ and $ZrO_2$ particles, and a main glass layer 16 which is provided on the oxide particle dispersed glass layer 14 and is free from the aforementioned oxide particles. The substrate 30 according to the third embodiment also need not have the $Al_2O_3$ layer 12, as is the case with the first substrate 10 with the variant configuration mentioned above.

As is shown in FIG. 5(e) and FIG. 6(e), the aluminum nitride substrate 40 for high-density mounted modules, according to a fourth embodiment of the present invention, has such a configuration that the oxide particle-dispersed glass layer 14 of the aluminum nitride substrate 30 according to the third embodiment has one or more first openings 14a, the main glass layer 16 has one or more second openings 16a which correspond to the respective first openings 14a, and these first and second openings 14a and 16a collectively serve as a space 17 for mounting an IC chip 18 therein.

Though not shown, another configuration of the aluminum nitride substrate 40 according to the fourth embodiment of the present invention involves the glass-mixed $Al_2O_3$ layer comprising $Al_2O_3$ and glass mixed therewith, formed directly on the aluminum nitride sinter without an $Al_2O_3$ layer.

As is shown in FIG. 7(f) and FIG. 8(f), the aluminum nitride substrate 50 for high-density mounted modules according to the fifth embodiment of the present invention is constructed in such a manner that a $SiO_2$ layer 15 is provided at least on the glass-mixed $Al_2O_3$ layer 13 or the $Al_2O_3$ layer 12 which faces the first opening 14a of the oxide particle-dispersed glass layer 14, and an IC chip 18 is mounted on the $SiO_2$ layer.

According to a method of producing the aluminum nitride substrate according to the first embodiment of the present invention, as is shown in FIG. 5(a) and (b), a plate-like aluminum nitride sinter 11 is oxidized to convert the surface of the sinter 11 into an $Al_2O_3$ layer 12', and, as is shown in FIG. 5(c), softened glass penetrates into fine pores of the $Al_2O_3$ layer 12' to change the $Al_2O_3$ layer 12' into a combination of an $Al_2O_3$ layer 12 and a glass-mixed $Al_2O_3$ layer 13, layered in that order when viewed from the side of the sinter 11.

According to a method of producing the aluminum nitride substrate according to the second embodiment of the present invention, as is shown in FIG. 5(a) and (b), a plate-like aluminum nitride sinter 11 is oxidized to form an $Al_2O_3$ layer 12' on the sinter 11, and then softened glass penetrates into fine pores of the $Al_2O_3$ layer 12' to form a three-layer structure on the sinter 11 which consists of an $Al_2O_3$ layer 12, a glass-mixed $Al_2O_3$ layer 13 and a main glass layer 16, as is shown in FIG. 2.

According to a method of producing the aluminum nitride substrate according to the third embodiment of the present invention, as is shown in FIG. 5(a) through (c), a plate-like aluminum nitride sinter 11 is oxidized to form an $Al_2O_3$ layer 12' on the sinter 11, and softened glass penetrates into fine pores of the $Al_2O_3$ layer 12' to change the above $Al_2O_3$ layer 12' into a combination of an $Al_2O_3$ layer 12 and a glass-mixed $Al_2O_3$ layer 13 layered in that order when viewed from the side of the sinter 11. Then, as is shown in FIG. 3, formed on the glass-mixed $Al_2O_3$ layer 13 is a glass layer 14 which comprises one or more oxide particles dispersed therein which are selected from the group consisting of $Al_2O_3$, $TiO_2$ and $ZrO_2$ particles, and a main glass layer 16 free from the aforementioned dispersion of oxide particles, is formed on the oxide particle-dispersed glass layer 14.

According to an alternative method of producing the aluminum nitride substrate according to the third embodiment of the present invention, as is shown in FIG. 6(a) and (b), a plate-like aluminum nitride sinter 11 is oxidized to form an $Al_2O_3$ layer 12' on the sinter 11. As is shown in FIG. 6(c), onto the resulting $Al_2O_3$ layer 12' there is applied a paste prepared by dispersing $SiO_2$ particles and one or more oxide particles selected from the group consisting of $Al_2O_3$, $TiO_2$ and $ZrO_2$ particles in a solvent, and this is followed by drying and sintering to form a composite or compound layer 14' of the $SiO_2$ particles and the oxide particles. Then, as is shown in FIG. 6(d), FIG. 6(e) and FIG. 3, the top surface of the composite or compound layer 14' is coated with a paste prepared by dispersing glass particles in a solvent, to form a glass particle layer 16' by drying the paste. This is followed by a heat treatment at a temperature which causes softening of the glass particle layer 16'; the softened glass of the glass particle layer 16' dissolves the $SiO_2$ particles of the composite or compound layer 14' and then penetrates into the $Al_2O_3$ layer 12', thereby forming a four-layer structure on the sinter 11 which consists of an $Al_2O_3$ layer 12, a glass-mixed $Al_2O_3$ layer 13, an oxide particle-dispersed glass layer 14 and a main glass layer 16.

According to a method of producing the aluminum nitride substrate for high-density mounted modules according to the fourth embodiment of the present invention, as is shown in FIG. 5(a) through (c), an $Al_2O_3$ layer 12 and a glass-mixed $Al_2O_3$ layer 13 are arranged in that order when viewed from the side of the sinter 11. Then, as is shown in FIG. 5(d), onto the glass-mixed $Al_2O_3$ layer 13 is applied a paste prepared by dispersing glass particles and one or more oxide particles selected from the group consisting of $Al_2O_3$, $TiO_2$ and $ZrO_2$ particles in a solvent, in a pattern, followed by drying and sintering to form a glass layer 14 with one or more first openings 14a. Thereafter, as shown in FIG. 5(e), a paste prepared by dispersing glass particles in a solvent is applied onto the oxide particle-dispersed glass layer 14 in the same pattern as mentioned before, followed by drying and sintering to form a main glass layer 16 with one or more second openings 16a, resulting in the formation on the sinter 11 of a four-layer structure consisting of the $Al_2O_3$ layer 12, glass-mixed $Al_2O_3$ layer 13, oxide particle-dispersed glass layer 14 and main glass layer 16, or a three-layer structure consisting of the glass-mixed $Al_2O_3$ layer 13, oxide particle-dispersed glass layer 14 and main glass layer 16, with the first and second openings 14a and 16a, collectively serving as a space for mounting an IC chip 18 therein.

According to an alternative method of producing the aluminum nitride substrate for high-density mounted modules according to the fourth embodiment of the present invention, in the same manner as the aforementioned alternative method of producing the aluminum nitride according to the third embodiment, as is shown in FIG. 6(a) and (b), the surface of an aluminum nitride sinter 11 is converted into an $Al_2O_3$ layer 12, and then, as is shown in FIG. 6(c), a composite or compound layer 14' of oxide particles and $SiO_2$ particles is formed with one or more first openings 14a' by application onto the layer 12 of a paste prepared by dispersing oxide particles and $SiO_2$ particles in a solvent, in a pattern, followed by drying and sintering. Thereafter, when a glass particle layer 16' is formed, as is shown in FIG. 6(d), a paste prepared by dispersing glass particles in a solvent is applied onto the composite or compound layer 14' in the same pattern as mentioned before, and dried to provide one or more openings 16a'. First and second openings 14a and 16a collectively serve as a space 17 for mounting an IC chip 18; at the same time a four-layer structure is formed on the sinter 11 which consists of an $Al_2O_3$ layer 12, a glass-mixed $Al_2O_3$ layer 13, an oxide particle-dispersed glass layer 14 and a main glass layer 16.

As illustrated in FIG. 7(c) through (e), a method for producing the aluminum nitride substrate for high-density mounted modules according to the fifth embodiment of the present invention, contains a step of forming a $SiO_2$ layer 15' on the glass-mixed $Al_2O_3$ layer 13, between the step of forming a glass-mixed $Al_2O_3$ layer 13 and the step of forming an oxide particle-dispersed glass layer 14, both of which are included in the method of producing the aluminum nitride substrate according to the fourth embodiment. As illustrated in FIG. 8(b) through (d), an alternate method of producing the aluminum nitride substrate according to the fifth embodiment contains a step of forming a $SiO_2$ layer 15' on the $Al_2O_3$ layer 12' between the step of forming an $Al_2O_3$ layer 12' and the step of forming a composite or compound layer 14' of oxide particles and $SiO_2$ particles, both of which are included in the alternative method of producing the aluminum nitride substrate according to the fourth embodiment.

The plate-like aluminum nitride sinter used in the present invention may be any sintered product which contains mainly aluminum nitride and may also contain any of a variety of additives, e.g., CaO, $Y_2O_3$, etc., without being limited to a sinter of aluminum nitride alone.

An $Al_2O_3$ layer to be provided on the sinter may be prepared by subjecting an aluminum nitride sinter to heat treatment in an atmosphere with an oxygen partial pressure of $1 \times 10^{-2}$ atm or higher and a hydrogen partial pressure of $1 \times 10^{-3}$ atm or lower, at 1,100°–1.500° C., including all valve therebetween, for 0.5–3 hours, including all times therebetween. As the temperature increases, the treatment period may be shortened. The heat treatment oxidizes the surface of the aluminum nitride sinter to form a porous $Al_2O_3$ layer having a volume porosity of 0.01–15%, including all values therebetween.

(a) First aluminum nitride substrate

An aluminum nitride substrate according to the first embodiment of the present invention (hereunder referred to as the first aluminum nitride substrate) may be prepared by applying a paste prepared by dispersing glass particles in a solvent onto the above $Al_2O_3$ layer having a volume porosity of 0.01–15%, including all values therebetween, and then the resulting composite is dried, sintered and subsequently heat-treated at a temperature which causes softening of the glass. This allows the softened glass to penetrate into fine pores in the upper portion of the $Al_2O_3$ layer. Here it is necessary to control the conditions for softening the glass layer so that the softened glass does not reach the aluminum nitride sinter. In other words, the $Al_2O_3$ layer must be partially preserved on the aluminum nitride sinter. This is necessary to prevent generation of air bubbles at the interface with the sinter due to reaction between the glass and the sinter. As shown in FIG. 1, the aluminum nitride substrate is constructed with an $Al_2O_3$ layer 12 formed by oxidation which is free of the penetrated glass, and a glass-mixed $Al_2O_3$ layer 13 containing $Al_2O_3$ mixed with the penetrated glass, arranged on the sinter 11. The surface of this glass-mixed $Al_2O_3$ layer 13 may be partially covered with a glass layer 16, or, though not illustrated, the glass layer 16 may be absent, depending on the softening conditions for the glass layer, etc.

The first aluminum nitride substrate may also be prepared by impregnating the above $Al_2O_3$ layer with an alkoxide or sol as a glass precursor, and then sintering the resulting composite to fix the glass in the above $Al_2O_3$ layer. According to this alternative method, there is no need to preserve the $Al_2O_3$ layer 12 free of penetrated glass, and an aluminum nitride substrate free of the $Al_2O_3$ layer 12 may be prepared without generating gas bubbles at the junction interface between the sinter 11 and the glass-mixed $Al_2O_3$ layer 13. This method may also be applied to the preparation of the aluminum nitride substrates according to the second and third embodiments of the present invention, as mentioned later.

The first aluminum nitride substrate 10 is suitable as a substrate for thermal heads which contain a glass-grazed layer formed on the surface of the substrate.

(b) Second aluminum nitride substrate

As is shown in FIG. 2, the aluminum nitride substrate 20 according to the second embodiment of the present invention (hereunder referred to as the second aluminum nitride substrate) is prepared by applying more glass onto the $Al_2O_3$ layer than in the case of the preparation of the first aluminum nitride substrate 10, and providing a main glass layer 16 on a glass-mixed $Al_2O_3$ layer 13. Since the entire surface of the glass-mixed $Al_2O_3$ layer 13 is covered with the main glass layer 16, and the surface of the aluminum nitride substrate 20 is covered with glass throughout, this substrate 20 is chemically more stable than the aluminum nitride substrate 10. In order to form the main glass layer 16, a relatively large amount of glass may be used in the process of penetrating the glass into the $Al_2O_3$ layer in the same manner as for the preparation of the above first aluminum nitride substrate, or, alternatively, after the glass has been penetrated into the above $Al_2O_3$ layer, the glass layer may be formed separately in the same manner as for the preparation of the above first aluminum nitride substrate. The second aluminum nitride substrate 20 is suitable as a substrate for thermal heads and as a substrate for thick-film circuits.

(c) Third aluminum nitride substrate

The aluminum nitride substrate according to the third embodiment of the present invention (hereunder referred to as the third aluminum nitride substrate) which is shown in FIG. 3, may be prepared by either of the following two methods. First, a paste prepared by dispersing glass particles in a solvent is applied onto an $Al_2O_3$ layer in almost the same volume as for the preparation of the first aluminum nitride substrate, and the resulting composite is dried and sintered to force the softened glass into fine pores of the above $Al_2O_3$ layer, converting the $Al_2O_3$ layer into an $Al_2O_3$ layer 12 and a glass-mixed $Al_2O_3$ layer 13 arranged in that order when viewed from the side of the sinter 11. Onto the glass-mixed $Al_2O_3$ layer 13 is then applied a paste prepared by dispersing glass particles and one or more oxide particles selected from the group consisting of $Al_2O_3$, $TiO_2$ and $ZrO_2$ particles, in a solvent, and the resulting composite is dried and sintered to soften the glass particles, forming a glass layer 14 with the above oxide particles penetrated therein. Then, onto this oxide particle-penetrated glass layer 14 is applied a paste prepared by dispersing glass particles in a solvent, followed by drying and sintering to soften the glass particles, thereby forming a main glass layer 16.

The third aluminum nitride substrate 20 shown in FIG. 3 may also be prepared by an alternative method. First, onto an $Al_2O_3$ layer, formed in the same manner as in the case of the formation of the first aluminum nitride substrate, there is applied a paste prepared by dispersing $SiO_2$ particles and one or more oxide particles selected from the group consisting of $Al_2O_3$, $TiO_2$ and $ZrO_2$ particles in a solvent, followed by drying and sintering to form a composite or compound layer of the oxide particles and $SiO_2$ particles. Thereafter, onto this composite or compound layer is applied a paste prepared by dispersing glass particles in a solvent, followed by drying to form a glass particle layer. Finally, the resulting composite undergoes heat treatment at a temperature which causes softening of the glass particle layer so that the softened glass of the above glass particle layer dissolves the $SiO_2$ particles in the above composite or compound layer and further penetrates into the above $Al_2O_3$ layer. In this way, as shown in FIG. 3, an aluminum nitride substrate 30, is prepared with a four-layer structure consisting of an $Al_2O_3$ layer 12, a glass-mixed $Al_2O_3$ layer 13, an oxide particle-dispersed glass layer 14 and a main glass layer 16. Also in this case, it is necessary to control the conditions for softening the glass layer so that the softened glass does not reach the aluminum nitride sinter. In other words, the $Al_2O_3$ layer must be partially preserved on the aluminum nitride sinter.

The aluminum nitride substrate 30 is suitable as a substrate for thin-film circuits, as a substrate for thick-film circuits and as a substrate for thermal heads.

(d) Fourth aluminum nitride substrate

An aluminum nitride substrate for high-density mounted modules according to the fourth embodiment of the present invention (hereunder referred to as the fourth aluminum nitride substrate) may be prepared by either of the following two methods. First, as shown in FIG. 5(b) and (c), onto an $Al_2O_3$ layer 12' having a volume porosity of approximately 0.01–15%, including all values therebetween, is applied a paste prepared by dispersing glass particles in a solvent, and the resulting composite is dried, sintered and subjected to heat treatment at a temperature which causes softening of the glass, allowing the glass to penetrate into fine pores of the $Al_2O_3$ layer 12', thus converting the $Al_2O_3$ layer 12' into an $Al_2O_3$ layer 12 and a glass-mixed $Al_2O_3$ layer 13, arranged in that order when viewed from the side of the sinter 11. As is shown in FIG. 5(d), onto the glass mixed $Al_2O_3$ layer 13 is then applied a paste prepared by dispersing glass particles and one or more oxide particles selected from the group consisting of $Al_2O_3$, $TiO_2$ and $ZrO_2$ particles in a solvent, and the resulting composite is dried and sintered to soften the glass particles, forming a glass layer 14 with the above oxide particles penetrated therein. Then, as is shown in FIG. 5(e), onto this oxide particle-penetrated glass layer 14 is applied a paste prepared by dispersing glass particles in a solvent, followed by drying and sintering to soften the glass particle, thereby forming a main glass layer 16. The oxide particle-dispersed glass layer 14 and the main glass layer 16 are constructed with one or more first openings 14a and second openings 16a by application of a paste in a pattern by screen printing which is a thick-film printing process. The number and shape of these openings 14a and 16a depend on the number and shapes of the IC chips to be mounted.

An alternative method of producing the fourth aluminum nitride substrate for high-density mounted modules is shown in FIG. 6(b) and (c). Onto the above $Al_2O_3$ layer 12' is applied a paste prepared by dispersing $SiO_2$ particles and one or more oxide particles selected from the group consisting of $Al_2O_3$, $TiO_2$ and $ZrO_2$ particles in a solvent, followed by drying and sintering to form a composite or compound layer 14' of the oxide particles and $SiO_2$ particles. Then, as shown in FIG. 6(d), onto this composite or compound layer 14' is applied a paste prepared by dispersing glass particles in a solvent, followed by drying to form a glass particle layer 16'. When the composite or compound layer 14' of oxide particles and $SiO_2$ particles and the glass particle layer 16' are formed, one or more first openings 14a' and second openings 16a' are provided by application of a paste in a pattern by screen printing, which is the same thick-film printing process as is used in the above method. Finally, as is shown in FIG. 6(e), the composite undergoes heat treatment at a temperature which causes softening of the glass particle layer 16' so that the softened glass of the above glass particle layer 16' dissolves the $SiO_2$ particles in the above composite or compound layer 14', penetrating into the above $Al_2O_3$ layer 12', resulting in conversion of the first and second openings 14a' and 16a' into first and second openings 14a and 16a. In this way, an aluminum nitride substrate 40 is formed with a four-layer structure containing an $Al_2O_3$ layer 12, a glass-mixed $Al_2O_3$ layer 13, an oxide particle-dispersed glass layer 14 and a main glass layer 16 on a sinter 11, with the first and second openings 14a and 16a collectively serving as a space 17 for mounting an IC chip 18 therein.

Here, it is necessary to control the conditions for softening the glass layer so that the softened glass does not reach the aluminum nitride sinter in either of the two methods. In other words, the $Al_2O_3$ layer must be partially preserved on the aluminum nitride sinter.

In addition, the fourth aluminum nitride substrate for high-density mounted modules may also be prepared by impregnating the above $Al_2O_3$ layer 12' with an alkoxide or sol as a glass precursor, and then sintering the resulting composite to fix the glass in the above $Al_2O_3$ layer 12'. In this case, there is no need to preserve the $Al_2O_3$ layer 12 free of the penetrated glass, and there is prepared a substrate for high-density mounted modules with a three-layer structure containing a glass-mixed $Al_2O_3$ layer 13, an oxide particle-dispersed glass layer 14 and a main glass layer 16, without the $Al_2O_3$ layer 12, without generating air bubbles at the junction interface between the sinter 11 and glass-mixed $Al_2O_3$ layer 13.

(e) Fifth aluminum nitride substrate

The $SiO_2$ layer 15' of the aluminum nitride substrate 50 according to the fifth embodiment of the present invention, shown in FIG. 7(d) and 8(c) (hereunder referred to as the fifth aluminum nitride substrate), is formed by forming a glass-mixed $Al_2O_3$ layer 13 or an $Al_2O_3$ layer 12' and then dip-coating a sinter 11 with a silicon alkoxide solution, or adding dropwise the solution in a uniform manner to the surface of the glass-mixed $Al_2O_3$ layer 13 or an $Al_2O_3$ layer 12' while rotating the composite of the sinter 11 for spin coating, and then sintering the composite.

The glass component of the main glass layer, oxide particle-dispersed glass layer and glass-mixed $Al_2O_3$ layer of the first through fifth aluminum nitride substrates, is a $PbO$—$SiO_2$—$B_2O_3$-based mixture containing an additive such as $Al_2O_3$, an alkaline earth metal or alkali metal. For sintering the glass layer is prepared by mixing powder of such a glass with a solvent to prepare a glass paste which is then applied onto the $Al_2O_3$ layer for coating by a method such as screen printing, spray coating, dip coating, spin coating or the like, and drying the coated product, and the glass-mixed $Al_2O_3$ layer 13 is formed on the $Al_2O_3$ layer 12 by sintering. This glass layer may also be prepared by applying the glass paste to a plastic base sheet, overlaying the sheet on the $Al_2O_3$ layer with its pasted surface facing the top surface of the $Al_2O_3$ layer and peeling off the base sheet, or by a sol-gel method or by sputtering.

The glass-mixed $Al_2O_3$ layer 13 of the first through fifth aluminum nitride substrates contains 0.01–15%, including all values therebetween, by volume of glass depending on the porosity of the $Al_2O_3$ layer 12', and preferably the oxide particle-dispersed glass layer 14 contains 5% or more by volume, but less than 100% by volume, including all values there between, of glass. In addition, regarding the thickness of the respective layers, the main glass layer 16 is formed to a thickness of 0.1–10,000 μm and preferably 1.0–10,000 μm, including all values therebetween, the oxide particle-dispersed glass layer 14 is formed to a thickness of 0.1–10, 000 μm and preferably 1.0–10,000 μm, including all values therebetween, the glass-mixed $Al_2O_3$ layer 13 is formed to a thickness of 0.01–10 μm, including all values therebetween, and the $Al_2O_3$ layer 12 is formed to a thickness of 0–9.99 μm, including all values therebetween. Meanwhile, the $SiO_2$ layer 15 is formed to a thickness of 0.1–1.0 μm, including all values therebetween. In cases where the thickness of the $SiO_2$ layer is less than 0.1 μm, the problem of the prior art mentioned in (3) above is reproduced when IC chips are mounted, and generation of gas cannot be prevented due to reaction between the glass component of the thick film and the nitrogen component of the AlN. On the other hand, the $SiO_2$ layer tends to crack at a thickness exceeding 1.0 μm. The thickness of the $SiO_2$ layer may be controlled by adjustment of the lifting speed in dip coating and adjustment of the rotation speed in spin coating.

In either of the first through fifth aluminum nitride substrates, the $Al_2O_3$ layer has good compatibility with the sinter 11 at the interface therewith, and thus is firmly bonded to the sinter 11. The $Al_2O_3$ layer functions as the barrier layer for the sinter 11 which obstructs dispersion of the glass into it, and prevents generation of air bubbles at the interface with the sinter 11.

Since the thermal expansion coefficient of aluminum nitride, approximate $4\times10^{-6}/°C$., is lower than the thermal expansion coefficient of $Al_2O_3$, $7-8\times10^{-6}/°C$., the thermal expansion coefficient of the glass-mixed $Al_2O_3$ layer 13 which is formed by penetration of glass into the $Al_2O_3$ layer approaches that of aluminum nitride in cases where the thermal expansion coefficient of the glass is lower than that of $Al_2O_3$, thereby relieving the thermal stress which occurs during the heat treatment for the formation of the layer, to a sufficient level to prevent cracking of the $Al_2O_3$ layer.

Since particles of $Al_2O_3$, $TiO_2$, $ZrO_2$, etc. with higher thermal conductivities than glass are dispersed in the oxide particle-dispersed glass layer 14 of the third through fifth aluminum nitride substrates, the layer 14 has an increased thermal conductivity which contributes to the improved heat dissipation properties of the substrates 30, 40 and 50. In addition, the formation of the oxide particle-dispersed glass layer 14 serves to improve the surface smoothness of the glass-mixed $Al_2O_3$ layer. Accordingly, improvement in the substrate surface smoothness may be accomplished even with aluminum nitride substrates with relatively large surface roughness by diminishing the substrate surface roughness.

In cases where the aluminum nitride substrates according to the third through fifth embodiments are prepared by the alternative methods, the $Al_2O_3$, $TiO_2$ and $ZrO_2$ particles bar passage of the softened glass through the $Al_2O_3$ layer during the final process of sintering the glass, and as a result serve an additional function of impeding the softened glass from reaching the aluminum nitride sinter.

As shown in FIG. 5(e), FIG. 6(e), FIG. 7(f) and FIG. 8(f), on the main glass layer 16 there can be formed a glass layer 21 with a lower softening point than the main layer 16 to adjust the depth of the space 17 to almost the same as the thickness of the IC chip 18. Then a thin-film multilayered circuit 22 can be formed which contains an insulator layer of a polyimide or the like and an conductive layer of a metal, such as Cu. The glass-containing layers 13, 14, 16 and 21 steadily stop up possible surface defects of the aluminum nitride sinter 11, such as voids, and thus the thermal expansion of air in the defects is suppressed and bulging of the polyimide thin film of the thin-film multilayered circuit 22 is prevented.

When an IC chip 18 is to be mounted in the space 17 in FIG. 5(e) or FIG. 6(e), an adhesive agent 19, such as an epoxy resin, is applied to the surface of the glass-mixed $Al_2O_3$ layer 13 or the $Al_2O_3$ layer 12, and then the IC chip 18 is mounted. Separately, in cases where an IC chip 18 is to be mounted in the space 17 in FIG. 7(f) or FIG. 8(f), the surface of the $SiO_2$ 15 is metallized by thick-film printing and the IC chip 18 is mounted by die bonding to the thick-film section with solder (not shown).

An IC chip is an integrated circuit. Solvents suitable for the pastes are aqueous and non-aqueous solvents, as well as organic solvents, and mixtures thereof. The specific solvent is chosen so as not to adversely react with any of the components of the paste, or anything which the paste may come into contact with, under the condition used. Preferred solvents are propyl cellosolve and the like.

DESCRIPTION OF THE PREFERRED EMBODIMENTS

Referring now to the drawings, like reference numerals designate identical or corresponding parts throughout the several views.

Other features of the invention will become apparent in the course of the following descriptions of exemplary embodiments which are given for illustration of the invention and are not intended to be limiting thereof.

EXAMPLE 1

This example deals with the third aluminum nitride substrate. First, from a 1 mm-thick aluminum nitride sinter there was cut a 76×76 mm square which was then subjected to heat treatment in the air at 1300° C. for 1 hour to form a 3.0 μm-thick $Al_2O_3$ layer on the surface of the sinter.

A paste was prepared by dispersing 34% by weight of $Al_2O_3$ particles and 66% by weight of $SiO_2$ particles in a solvent in a uniform manner, and the paste was applied to the above $Al_2O_3$ layer, followed by drying at 300° C. for 1 hour and then sintering at 1100° C. for 1 hour to form a composite or compound layer of the $Al_2O_3$ particles and the $SiO_2$ particles. Then, onto this composite or compound layer there was applied a paste prepared by dispersing glass particles in a solvent in a uniform manner, and the product was dried at 150° C. for 30 minutes to form a glass particle layer. Subsequently, the product was sintered at 1000° C. for 30 minutes to soften the glass of the glass particle layer. By following the above procedures, an $Al_2O_3$ layer, a glass-mixed $Al_2O_3$ layer, an oxide particle-dispersed glass layer and a main glass layer were formed on the aluminum nitride sinter in that order to prepare the aluminum nitride sinter as shown in FIG. 3.

Figure 4:
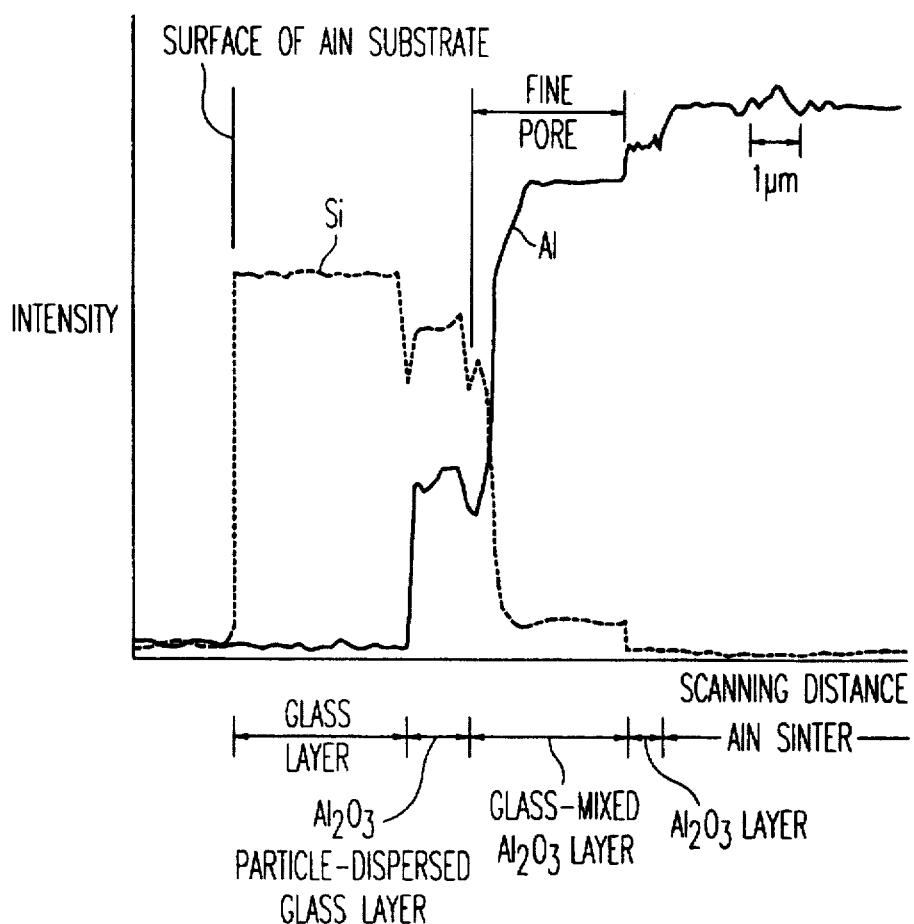
FIG. 4 is a linear analytical chart of the section of an aluminum nitride substrate according to a third embodiment of the present invention, obtained with an electron probe microanalyzer.

The substrate 30 was cut into a sample with a size of 10×10 mm which was then buried in an epoxy resin. After the epoxy resin was cured to a satisfactory level, the cut surface of the sample was polished. The polishing was continued until the polished surface attained a mirror-smooth state. Gold was evaporated onto the mirror-finished sample, after which the cut surface underwent linear analysis with an electron probe microanalyzer (EPMA) to observe the state of the respective layers formed on the aluminum nitride sinter. The results are shown in FIG. 4. In FIG. 4, the axis of abscissa indicates the scanning distance from the surface of the sample to the sinter, while the axis of ordinate indicates the intensity. In the drawing, the solid line shows the concentration distribution of Al, and the broken line shows the concentration distribution of Si.

As is apparent in FIG. 4, the $Al_2O_3$ layer 12 was approximately 0.8 μm, the glass-mixed $Al_2O_3$ layer 13 was approximately 2.2 μm in, the $Al_2O_3$ particle-dispersed glass layer 14 was approximately 2 μm, and the main glass layer 16 was approximately 4 μm. These sizes allowed formation of a laminate with an extremely small thickness on the order of 9 μm on the aluminum nitride sinter, without causing generation of air bubbles at the interface with the sinter.

In order to evaluate the surface smoothness of the aluminum nitride substrate 30 prepared in Example 1, the surface roughness was measured with a surface roughness tester. For comparison, the aluminum nitride sinter used in Example 1 was also measured. The results were that the aluminum nitride sinter had an average roughness Ra of 0.4 μm and a maximum roughness Rmax of 3.0 μm, whereas the substrate 30 prepared in Example 1 demonstrated an average roughness Ra of 0.06 μm and a maximum roughness Rmax of 0.5 μm; these values prove that the substrate 30 prepared in Example 1 has a much smoother surface than the aluminum nitride sinter. It is preferable to have a substrate with Ra and Rmax less than that of the aluminum nitride sinter.

Further, in order to evaluate the corrosion resistance of the aluminum nitride sinter 30 prepared in Example 1, a 25×25 mm specimen was cut from the substrate 30, and only the portion of the substrate which consisted of the $Al_2O_3$ layer, the glass-mixed $Al_2O_3$ layer, the oxide particle-dispersed glass layer and the main glass layer was immersed in an alkaline solution at pH 13 for 24 hours. No dissolution of the substrate was observed after 24 hours. For comparison, one end of a 10×10 mm cut specimen of an aluminum nitride sinter was immersed in an alkaline solution at pH 13 in the same manner as the above for 24 hours. In 24 hours, the sinter was found to have undergone 2 mg/cm² of dissolution. These facts prove that the substrate 30 prepared in Example 1 has excellent corrosion resistance and that an etching of a thin film is easy for formation of thin-film circuits.

In order to evaluate the heat dissipation properties of the aluminum nitride substrate prepared in Example 1, a sample 10 mm in diameter was cut from the substrate 30, and its thermal conductivity was measured to be 160 W/m·K by the laser flash method. This result proves reduction in the thermal conductivity of the substrate prepared in Example 1 of approximately 5% with respect to the thermal conductivity of the aluminum nitride sinter (170 W/m·K). It is preferable to have a substrate with a thermal conductivity greater than 20 W/m·K.

In order to evaluate the degree of bonding between the aluminum nitride substrate 30 prepared in Example 1 and a thin film, a 25×25 mm sample was cut from the substrate 30, and Cr was sputtered on the prepared 2 mm-square pad to a thickness of 0.1 μm followed by sputtering of 5 μm-thick Cu to form a Cu/Cr film. A Cu wire 1 mm in diameter was fixed and soldered on the 2 mm-square pad with Pb/Sn (40:60) eutectic solder, and was then subjected to thin-film peeling testing. The bond strengths observed all were 5 kg per 2 mm-square or greater, and rupture modes were found only in the substrate.

EXAMPLE 2

This example deals with the fifth aluminum nitride substrate for high-density mounted modules. First, as shown in FIGS. 8(a) and (b), from a 1 mm-thick aluminum nitride sinter there was cut a 76×76 mm square which was then subjected to heat treatment in the air at 1300° C. for 1 hour to form a 3.0 μm-thick $Al_2O_3$ layer 12' on the surface of the sinter 11. Then, the sinter with the $Al_2O_3$ layer formed thereon was immersed in a solution prepared by adding ethanol, isopropyl alcohol and a 0.1% HCl to ethyl silicate as a silicon alkoxide, and pulled up at a rate of 15 cm/min., followed by drying at 100° C. for 1 hour and sintering at 900° C. for 1 hour. The $SiO_2$ layer 15' shown in FIG. 8(c) was formed in this way.

A paste was prepared by dispersing 34% by weight of $Al_2O_3$ particles and 66% by weight of $SiO_2$ particles in a solvent in a uniform manner, and the paste was applied to the above $SiO_2$ layer 15' in a given pattern by screen printing, followed by drying at 300° C. for 1 hour and then sintering at 1100° C. for 1 hour to form a composite or compound layer 14' of the $Al_2O_3$ particles and the $SiO_2$ particles, as shown in FIG. 8(d). Then, onto this composite or compound layer 14' was applied a paste prepared by dispersing glass particles in a solvent in a uniform manner, in the same pattern as the above by screen printing, and the product was dried at 150° C. for 30 minutes to form a glass particle layer 16, as shown in FIG. 8(e). Subsequently, the product was sintered at 1000° C. for 30 minutes to soften the glass of the glass particle layer 16'. By following the above procedures, as shown in FIG. 8(e), an $Al_2O_3$ layer 12, a glass-mixed $Al_2O_3$ layer 13, an oxide particle-dispersed glass layer 14 and a main glass layer 16 were formed on the aluminum nitride sinter 11 in that order; in the oxide particle-dispersed glass layer 14 and the main glass layer 16 there were formed openings 14a and 16a collectively serving as a space 17 for mounting an IC chip therein. The $SiO_2$ layer 15 was exposed to the space 17.

As shown in FIG. 8(f), on the main glass layer 16 was formed a glass layer 21 with a lower softening point than the main layer 16 to adjust the depth of the space 17 to almost the same as the thickness of the IC chip 18. The IC chip 18 was then mounted with an epoxy resin. Thereafter, a polyimide thin film was formed on the glass layer 21 and the IC chip 18 by spin coating, and the composite was sintered in an atmosphere of nitrogen at 400° C. for 1 hour. A microscopic observation was conducted to determine whether the polyimide thin film had bulged, and no bulge was found.

In order to mount the IC chip 18 in the space 17, the surface of the $SiO_2$ layer 15 was metallized by thick-film printing, and then the IC chip 18 was mounted by die bonding to the thick-film section with solder (not shown). Bonding between the thick film and the substrate was measured by die shear testing, and all the rupture modes were in the chip and the substrate. This suggests that the $SiO_2$ layer 15 functioned as the barrier layer against the glass in the thick film during the sintering of the thick film, thus preventing the reaction between the glass component of the thick film and the sinter 11.

As described above, diffusion of glass into an $Al_2O_3$ layer which is an oxide layer on an aluminum nitride sinter according to the present invention allows more reduction in the thickness of the glass layer on the sinter as compared with the case of aluminum nitride substrates of the prior art and also provides heat dissipation properties closer to those of aluminum nitride itself. Particularly, use of the aluminum nitride substrates according to the present invention as substrates for high density mounted modules results in superior heat dissipation properties and allows higher-density mounting of devices such as IC chips, when compared with the performance of $Al_2O_3$ substrates of the prior art.

Preservation of the $Al_2O_3$ layer with no glass penetrated therein on the aluminum nitride sinter prevents generation of air bubbles at the junction interface between the aluminum nitride sinter and the glass-containing layer. In the case of the aluminum nitride substrate according to the third embodiment, since an oxide particle-dispersed glass layer is formed thereon, the glass layer is made even if the sinter has a large surface roughness, and therefore the substrate has excellent surface smoothness.

The present invention allows ready, stable and firm formation of a glass-grazed layer, conductor layer, etc. on an aluminum nitride substrate through provision of an intervening glass-mixed $Al_2O_3$ layer or main glass layer.

Since the area on which the thin-film multilayered circuit is to be mounted is coated with a main glass layer or an oxide particle-dispersed glass layer, bulging of the thin film is not caused by mounting of the thin-film multilayered circuit, and the bonding to the glass-containing layer is excellent.

In cases where the substrate surface which faces the space for mounting an IC therein is coated with a $SiO_2$ layer, no air bubbles are generated at the junction interface between the aluminum nitride sinter and the glass component-containing thick film, and thus a satisfactory level of bonding is established to accomplish ready, highly reliable mounting of IC chips.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An aluminum nitride substrate comprising:
   (a) a sinter comprising aluminum nitride;
   (b) a glass-mixed $Al_2O_3$ layer comprising $Al_2O_3$ and glass, on said sinter; and
   (c) optionally an intervening layer comprising $Al_2O_3$, between said sinter and said glass-mixed $Al_2O_3$ layers, wherein the glass-mixed $Al_2O_3$ layer (b) comprises 0.01–15% by volume of glass, and glass in the glass-mixed $Al_2O_3$ layer is present in pores of the $Al_2O_3$ in the glass-mixed $Al_2O_3$ layer.

2. The aluminum nitride substrate of claim 1, wherein the glass-mixed $Al_2O_3$ layer (b) has a thickness of 0.01–10 μm, and the intervening layer (c) has a thickness of 0–9.99 μm.

3. The aluminum nitride substrate of claim 1, wherein the glass-mixed $Al_2O_3$ layer (b) has a thickness of 0.01–10 μm, and the intervening layer (c) has a thickness of 0–9.99 μm.

4. An aluminum nitride substrate comprising:
   (a) a sinter comprising aluminum nitride;
   (b) a glass-mixed $Al_2O_3$ layer comprising $Al_2O_3$ and glass, on said sinter;

(c) optionally an intervening layer comprising $Al_2O_3$, between said sinter and said glass-mixed $Al_2O_3$ layer; and (d) a main glass layer on said glass-mixed $Al_2O_3$ layer, wherein the glass-mixed $Al_2O_3$ layer (b) comprises 0.01–15% by volume of glass, and glass in the glass-mixed $Al_2O_3$ layer is present in pores of the $Al_2O_3$ in the glass-mixed layer.

5. The aluminum nitride substrate of claim 4, wherein the glass-mixed $Al_2O_3$, layer (b) has a thickness of 0.01–10 μm, and the intervening layer (c) has a thickness of 0–9.99 μm.

6. The aluminum nitride substrate of claim 4, wherein the glass-mixed $Al_2O_3$ layer (b) has a thickness of 0.01–10 μm, and the intervening layer (c) has a thickness of 0–9.99 μm.

7. An aluminum nitride substrate comprising:

(a) a sinter comprising aluminum nitride;

(b) a glass-mixed $Al_2O_3$ layer comprising $Al_2O_3$ and glass, on said sinter;

(c) optionally an intervening layer comprising $Al_2O_3$, between said sinter and said glass-mixed $Al_2O_3$ layer;

(d) an oxide particle-dispersed glass layer comprising one or more oxide particles dispersed in glass, on said glass-mixed $Al_2O_3$ layer; and (e) a main glass layer which is free of said oxide particles, on said oxide particle-dispersed glass layer;

wherein said oxide particles comprise at least one oxide selected from the group consisting of $Al_2O_3$, $TiO_2$ and $ZrO_2$.

wherein the glass-mixed $Al_2O_3$ layer (b) comprises 0.01–15% by volume of glass, and glass in the glass-mixed $Al_2O_3$ layer is present in pores of the $Al_2O_3$ in the glass-mixed layer.

8. The aluminum nitride substrate of claim 7, wherein:

the oxide particle-dispersed glass layer (d) comprises one or more first openings on said glass-mixed $Al_2O_3$ layer;

the main glass layer (e) comprises one or more second openings on said first openings, each of said first and second openings integrally forming a cavity; and wherein an IC chip can be mounted in said cavity.

9. The aluminum nitride substrate of claim 8, wherein the glass-mixed $Al_2O_3$ layer (b) has a thickness of 0.01–10 μm, and the intervening layer (c) has a thickness of 0–9.99 μm.

10. The aluminum nitride substrate of claim 8, wherein the glass-mixed $Al_2O_3$ layer (b) comprises 0.01–15% by volume of glass, and the oxide particle-dispersed glass layer (d) comprises 5% to less than 100% by volume of glass.

11. The aluminum nitride substrate of claim 8, wherein the main glass layer (e) has a thickness of 0.1–10,000 μm, the oxide particle-dispersed glass layer (d) has a thickness of 0.1–10,000 μm, the glass-mixed $Al_2O_3$ layer (b) has a thickness of 0.01–10 μm, and the intervening layer (c) has a thickness of 0–9.99 μm.

12. The aluminum nitride substrate of claim 8, further comprising a $SiO_2$ layer, on a portion of said glass-mixed $Al_2O_3$ layer (b) or said intervening layer (c), which faces said first opening.

13. The aluminum nitride substrate of claim 12, wherein the glass-mixed $Al_2O_3$ layer (b) has a thickness of 0.01–10 μm, and the intervening layer (c) has a thickness of 0–9.99 μm.

14. The aluminum nitride substrate of claim 12, wherein the glass-mixed $Al_2O_3$ layer (b) comprises 0.01–15% by volume of glass, and the oxide particle-dispersed glass layer (d) comprises 5% to less than 100% by volume of glass.

15. The aluminum nitride substrate of claim 12, wherein the main glass layer (e) has a thickness of 0.1–10,000 μm, the oxide particle-dispersed glass layer (d) has a thickness of 0.1–10,000 μm, the glass-mixed $Al_2O_3$ layer (b) has a thickness of 0.01–10 μm, and the intervening layer (c) has a thickness of 0–9.99 μm.

16. The aluminum nitride substrate of claim 7, wherein the glass-mixed $Al_2O_3$ layer (b) has a thickness of 0.01–10 μm, and the intervening layer (c) has a thickness of 0–9.99 μm.

17. The aluminum nitride substrate of claim 7, wherein the glass-mixed $Al_2O_3$ layer (b) comprises 0.01–15% by volume of glass, and the oxide particle-dispersed glass layer (d) comprises 5% to less than 100% by volume of glass.

18. The aluminum nitride substrate of claim 7, wherein the main glass layer (e) has a thickness of 0.1–10,000 μm, the oxide particle-dispersed glass layer (d) has a thickness of 0.1–10,000 μm, the glass-mixed $Al_2O_3$ layer (b) has a thickness of 0.01–10 μm, and the intervening layer (c) has a thickness of 0–9.99 μm.

* * * * *